United States Patent

Schouhamer Immink

[11] Patent Number: 6,031,871
[45] Date of Patent: Feb. 29, 2000

[54] TRANSMISSION AND RECEPTION OF A DIGITAL INFORMATION SIGNAL

[75] Inventor: Kornelis A. Schouhamer Immink, Eindhoven, Netherlands

[73] Assignee: U.S. Philips Corporation, New York, N.Y.

[21] Appl. No.: 08/887,981

[22] Filed: Jul. 3, 1997

[30] Foreign Application Priority Data

Jul. 3, 1996 [EP] European Pat. Off. .............. 96201863

[51] Int. Cl.$^7$ .............................. H04B 1/66; H03M 7/00; H03M 5/00

[52] U.S. Cl. .............................. 375/240; 341/50; 341/55; 341/60; 341/95; 341/106; 714/746; 714/752; 714/758

[58] Field of Search .............................. 375/240; 341/50, 341/95, 106, 55, 60; 714/746, 752, 758, 759, 761, 762, 777, 781, 786, 787, 788, 799, 800, 806

[56] References Cited

U.S. PATENT DOCUMENTS

| 5,335,117 | 8/1994 | Park et al. ................................. 360/48 |
| 5,475,388 | 12/1995 | Gormish et al. ....................... 341/107 |
| 5,499,254 | 3/1996 | Ikekawa et al. ........................... 371/43 |
| 5,608,397 | 3/1997 | Soljanin .................................... 341/58 |
| 5,671,236 | 9/1997 | Denissen et al. .................... 371/37.07 |
| 5,771,244 | 6/1998 | Reed et al. ........................... 371/37.01 |

Primary Examiner—Stephen Chin
Assistant Examiner—Michael W. Maddox
Attorney, Agent, or Firm—Edward W. Goodman

[57] ABSTRACT

An apparatus for transmitting a digital information signal includes an input terminal for receiving the digital information signal, a first channel encoding unit for carrying out a first channel encoding step on an information word in a series of subsequent information words included in the digital information signal so as to obtain a channel word, a compression unit for carrying out a compression step on a channel word so as to obtain a compressed channel word, an error correction encoding unit for carrying out an error correction encoding of the compressed channel word so as to obtain a parity word, a second channel encoding unit for carrying out a second channel encoding step on the parity word so as to obtain a channel encoded parity word, and a formatting unit for combining the channel word and the channel encoded parity word into a composite transmission signal suitable for transmission via a transmission medium. With such apparatus, very long information words can be converted into channel words, while serious error propagation is avoided during transmission.

13 Claims, 2 Drawing Sheets

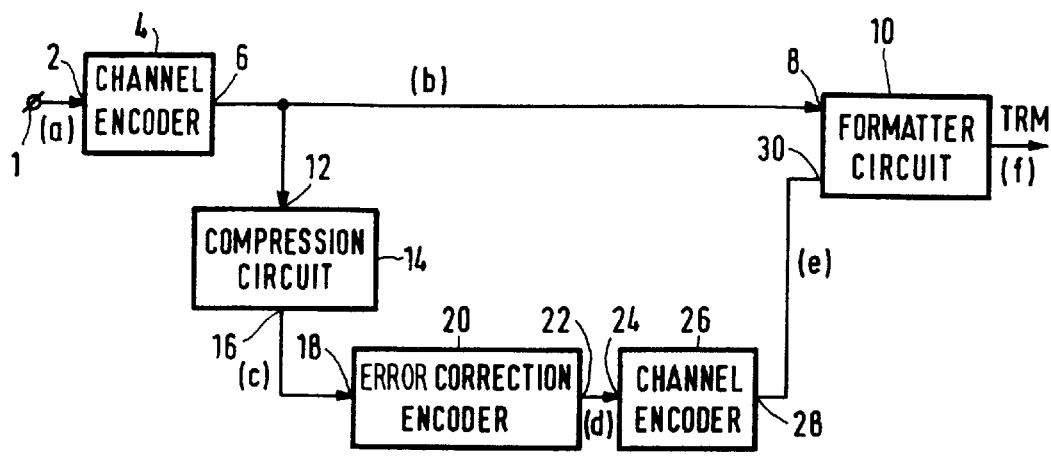
FIG.1
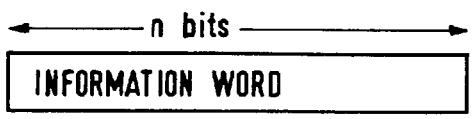
FIG.2a
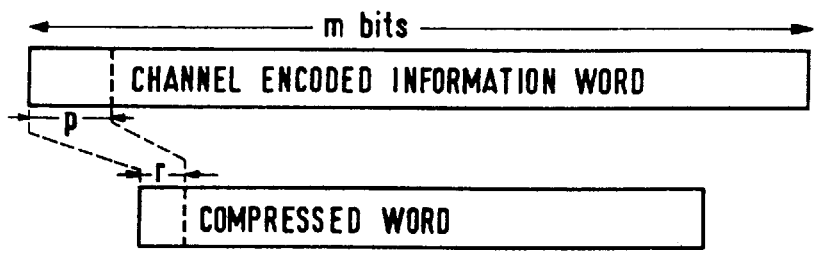
FIG.2b
FIG.2c
FIG.2d
FIG.2e
FIG.2f

TRANSMISSION AND RECEPTION OF A DIGITAL INFORMATION SIGNAL

FIELD OF THE INVENTION

The invention relates to the field of digital communications and more specifically to error correction of such information.

BACKGROUND OF THE INVENTION

The apparatus as defined in the foregoing is known from European Patent application EP 671,739 A2, corresponding to U.S. Pat. No. 5,644,582, document D1 in the list of related documents. The apparatus is in the form of an apparatus for recording the digital information signal on a record carrier, such as a magnetic record carrier, and comprises error correction encoding means and channel encoding means.

A convenient definition of channel coding is: the technique of realizing high transmission reliability despite shortcomings of the channel, while making efficient use of the channel capacity. In essence, information theory asserts that a stationary channel can be made arbitrarily reliable given that a fixed fraction of the channel is used for redundancy.

In transmission and recording/reproduction systems, source data is commonly translated in two successive steps: via (a) error-correction code and (b) channel (or modulation) code, see document D4 in the list of related documents.

Error-correction control is realized by adding extra symbols to the conveyed message. These extra symbols make it possible for the receiver to detect and/or correct some of the errors that may occur in the received message.

There are many different families of error-correcting codes. Of major importance for recording applications is the family of Reed-Solomon codes (RS). The reason for their pre-eminence in e.g. recording/reproduction systems is that they can combat combinations of random as well as burst errors. By exploiting the redundancy present in the retrieved signal, the decoder reconstitutes the input sequences as accurately as possible.

A channel encoder has the task of translating arbitrary user information plus error-correction symbols into a sequence that complies with the given channel constraints. Examples are spectral constraints or run-length constraints. The maximum information rate given the channel input constraints, is often called the Shannon capacity of the input-constrained noiseless channel. A good code embodiment realizes a code rate that is close to the Shannon capacity of the constrained sequences, uses a simple implementation, and avoids the propagation of errors at the decoding process, or, more realistically, a code with a compromise between these competing attributes.

Current recording code implementations are very often byte-oriented. The efficiency of such codes, in terms of channel capacity, is typically less than 95%. In accordance with the adage "The bigger the better", a greater code efficiency can only be realized by utilizing codes with very long codewords of typically 500–1000 bits. Although we know how to construct such efficient codes in theory, the key obstacle to practically approaching channel capacity is the massive hardware required for encoding and decoding, as hardware grows with the number of codewords used, i.e., exponentially with the codeword length.

The use of algebraic coding techniques, such as enumeration, makes it possible to implement codes whose complexity grows polynomially with the codeword length. The algebraic coding technique makes it possible to translate source words into codewords and vice versa by invoking an algorithm rather than performing the translation with a look-up table. Reference is made in this respect to the not yet published International Patent Application No. WO 96/00045, document D3 in the list of related documents.

A second drawback of the use of long codewords, however, is the risk of extreme error propagation. Single channel bit errors may result in error propagation which destroys the entire decoded word, and, of course, the longer the codeword the greater the number of symbols affected.

The above citations are hereby incorporated in whole by reference.

SUMMARY OF THE INVENTION

It is an object of the invention to provide an apparatus for transmission of a digital information signal and an apparatus for receiving the digital information signal, such that serious error propagation is avoided during transmission. The new signal processing provided in the transmitter and the inverse signal processing provided in the receiver pave the way to the successful use of channel codes having (very) long codewords, thereby practically achieving channel capacity.

In accordance with the invention, the apparatus for transmitting a digital information signal, comprises input means for receiving the digital information signal, first channel encoding means for carrying out a first channel encoding step on an information word in a series of subsequent information words comprised in the digital information signal so as to obtain a channel word, compression means for carrying out a compression step on a channel word so as to obtain a compressed channel word, error correction encoding means for carrying out an error correction encoding of the compressed channel word so as to obtain a parity word, second channel encoding means for carrying out a second channel encoding step on the parity word and so as to obtain a channel encoded parity word, formatting means for combining the channel word and the channel encoded parity word into a composite transmission signal suitable for transmission via a transmission medium. Further, the apparatus for receiving comprises receiving means for receiving a composite transmission signal comprising channel words and corresponding channel encoded parity words, demultiplexer means for retrieving a channel word and a corresponding channel encoded parity word from the composite transmission signal, compression means for carrying out a compression step on the channel word so as to obtain a compressed channel word, first channel decoding means for carrying out an channel decoding step on the channel encoded parity word so as to obtain a parity word corresponding to said compressed channel word, error correction decoding means for carrying out an error correction step on the compressed channel word using said parity word so as to obtain a corrected compressed channel word, expansion means for carrying out an expansion step on the corrected compressed channel word so as to obtain an uncompressed channel word, second channel decoding means for carrying out a channel decoding step on the uncompressed channel word and so as to obtain an information word, output means for supplying the digital information signal in the form of a sequence of information words.

The invention is based on the following recognition.

First, it should be noted here, that Bliss, see document D5 in the list of related documents, has proposed to revert the conventional order of the error-correction encoder and the channel encoder. In Bliss' coding format, the constrained codewords (the channel encoded information words) are treated as binary input data of an error correcting encoder in the usual way.

In a byte-oriented error control encoder (ECC), such as the popular Reed-Solomon encoder, the constrained codewords (the channel encoded information words) are grouped into bytes and the parity words generated are affixed to the end (or beginning) of the constrained codeword. The parity words thus generated do not, in general, obey the prescribed constraints and they are translated with the aid of a second channel encoder. Provisions have to be made for concatenating the various segments.

The corresponding decoding in the 'Bliss' scheme' is straightforward. We start by decoding the parity words using a corresponding channel code decoder. We can correct the errors in the constrained sequence (the sequence of channel encoded information words) and then a second channel decoder delivers the source sequence (the sequence of the information words). The efficiency of the channel code for the parity words may be much smaller than the channel code for the information words. However, as the number of parity bits is normally a small fraction of the number of input bits, the efficiency of the channel code for the parity words has a relatively small bearing on the overall efficiency. It is of paramount importance that the error propagation of the channel code for converting the parity words is limited to a few bits, preferably to a single byte in a byte-oriented system.

In the above 'Bliss' scheme', the constrained sequence is the input of the ECC encoder. Clearly, the constrained sequence is a factor of $1/R_1$ longer than the source data, where $R_1$ is the rate of the 1st channel encoder. Assume that the ECC is capable of correcting error bursts of a given length. Since the ECC operates on channel words, the corresponding number of user bytes it can correct is diminished by a factor of $R_1$. For recording systems, this implies that the burst error correction capability measured in geometrical units, e.g., meters, is reduced by the same factor $R_1$. Secondly, the length of the constrained sequence instead of the user sequence must be smaller than the maximum imposed by the RS code at hand. The above drawbacks of Bliss' scheme are so serious that in spite of its efficiency benefits, it is of limited practical usefulness in recording systems, where correction of burst errors is a major requirement.

These difficulties have been overcome, in accordance with the invention, by reconfiguring the codes and defining a third intermediate coding layer. Essentially, the constrained sequence (that is: the sequence of m-bit channel words) is compressed into a third intermediate sequence (a sequence of compressed channel words) before it is forwarded to the ECC coder.

In accordance with a further aspect of the invention, this compression is done by partioning the constrained sequence into blocks of p bits. The block length p is chosen so that the number of distinct constrained sequences of length p is not larger than N, the field size of the symbol error correcting ECC. Then, it is possible to define a one-to-one mapping between the p-tuples and the ECC symbols. Using a small look-up table, or enumeration, the p-tuples are uniquely translated into an intermediate sequence of bytes, the so-called compressed channel words. The number of bits of the compressed channel words so generated may be slightly larger than the number of bits of the original information words. The intermediate sequence of compressed channel words, in turn, is used as the input of the ECC encoder and the parity words are generated as usual. It should be appreciated that the intermediate sequence is not transmitted. The parity words are modulated by a 2nd constrained code (channel encoder) so as to obtain the channel encoded parity words.

The cascaded sequence, i.e., the constrained sequence followed by the constrained parity words, is transmitted or recorded.

Decoding is carried out in the following way. First, the parity words are found by applying a channel decoding step on the channel encoded parity words using the first channel decoder.

The information words are found as follows. Using the look-up table, the constrained sequence (the sequence of m-bit channel words is translated into a sequence of bytes. They may contain errors, which can be corrected by the RS decoder.

Then, after the ECC decoding operation, the corrected bytes are translated into the constrained sequence using the inverse of the look-up table. The corrected constrained sequence is subsequently decoded by the second channel decoder.

Those skilled in the art will understand the invention and additional objects and advantages of the invention by studying the description of preferred embodiments below with reference to the following drawings which illustrate every feature of the appended claims.

BRIEF DESCRIPTION OF THE DRAWINGS

FIG. 1 an embodiment of the transmitter apparatus.

FIG. 2a to FIG. 2f various words available at various locations in the transmitter apparatus.

DETAILED DESCRIPTION OF THE PREFERRED EMBODIMENT

Figure 3:
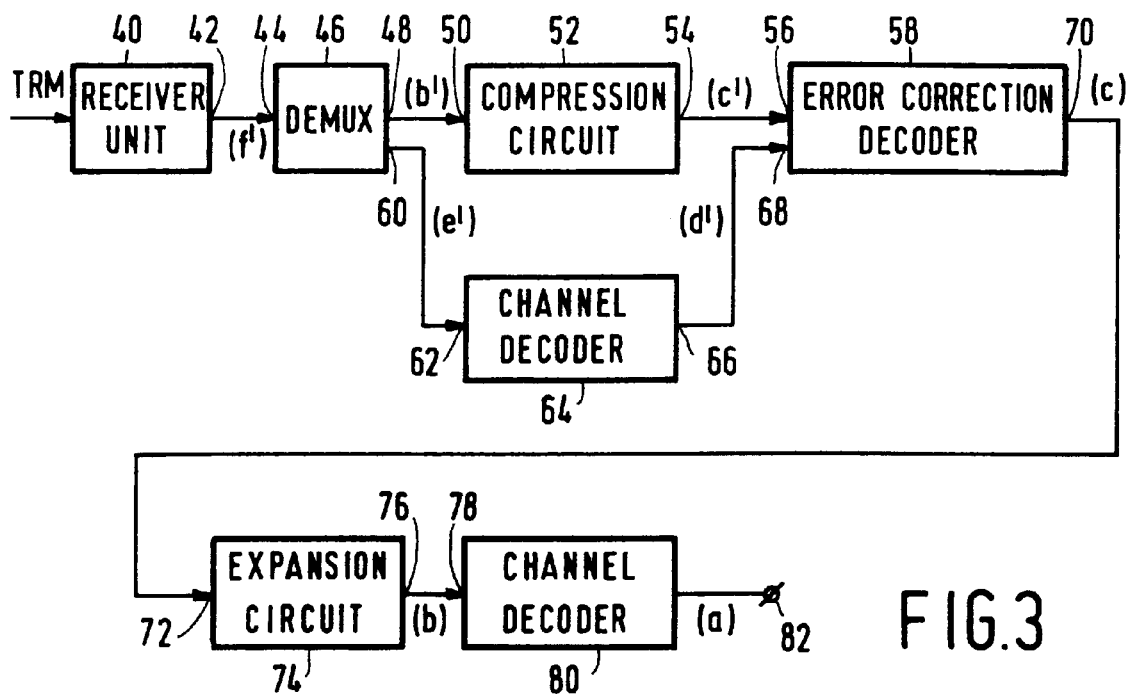
FIG. 3 an embodiment of the receiver apparatus.

FIG. 1 shows an embodiment of the transmitter apparatus in accordance with the invention. The apparatus comprises an input terminal 1 coupled to an input 2 of a channel encoder circuit 4. An output 6 of the channel encoder circuit 4 is coupled to a first input 8 of a formatter circuit 10 and to an input 12 of a compression circuit 14. An output 16 of the compression circuit 14 is coupled to an input 18 of an error correction encoding circuit 20, which has an output 22 which is coupled to an input 24 of a second channel encoder circuit 26. An output 28 of the channel encoder circuit 26 is coupled to a second input 30 of the formatter circuit 10.

The functioning of the embodiment of FIG. 1 will be explained hereafter, by making reference to the FIGS. 2a to 2f. The channel encoder 4 is adapted to convert n-bit information words, comprised in the information stream of the digital information signal applied to the input terminal 1, into m-bit channel words. FIG. 2a shows, schematically, an n-bit information word applied to the input 2 of the channel encoder 4 and FIG. 2b shows, schematically, an m-bit channel word supplied to the output 6 in response to the n-bit information word. The lengths of the information words and the channel words is relatively long compared to what is the normal practice in channel encoders. As an example, n=172 and m=312. This channel encoder thus has a rate of roughly 0.55. The channel encoder circuit 4 converts the sequence of n-bit information words into a sequence of m-bit channel words that satisfy a specific (d,k) constraint. As an example, d=2 and k=15.

The compression circuit 14 compresses each m-bit channel word into a corresponding compressed channel word of a lower number of bits. As an example, a compressed channel word can be 192 bits long. FIG. 2c shows schematically the compressed channel encoded information word.

This compression step can be realized by, first, partitioning a channel encoded information word in subwords of p bits each. In the above example, where m=312, p could be chosen equal to 13, so that 24 subwords are present in each channel encoded information word. Next, the compression circuit 14 converts each subword of p bits into converted subwords of a lower bit number, r. As an example, r=8. This means that, in the present example, the compressor circuit comprises a 13-to-8 bit converter. As a result, a compressed channel encoded information word comprises a sequence of 24 8-bit converted subwords, in the above example.

The conversion into converted subwords of 8 bits long has the advantage that in a simple way, an error correction encoding can be carried out on the compressed channel encoded information word.

It should further be noted that the choice for the value p, being the length of the subwords in the channel encoded information word, compared to the number r, is such that, at most, $2^r$ different subwords of length p occur in the channel encoded information words, so that the conversion from the p-bit subwords into the r-bit converted subwords is unambiguous. The conversion of the p-bit subwords into the r-bit converted subwords could be carried out using a look-up table.

The error correction encoding circuit 20 carries out a well known error correction encoding step on each compressed word so as to obtain a parity word, as shown in FIG. 2d. The parity word can be a number of bytes, e.g., 10 bytes, long. Next, the channel encoding circuit 26 converts the parity word into a channel encoded parity word, as shown in FIG. 2e. The channel encoding circuit 26 can be in the form of a 8-to-15 bit converter. The sequence of channel encoded parity words supplied by the channel encoder 26 should satisfy the same (d,k) requirements as given above for the sequence of channel encoded information words.

The formatter circuit 10 combines a channel encoded information word and a corresponding channel encoded parity word into one serial datastream, as shown in FIG. 2f. It will be clear that the (d,k) constraints mentioned above, should also be satisfied at the boundaries between the channel encoded information word and a previous or a subsequent channel encoded parity word.

The combined serial datastream can be supplied to a transmission medium TRM, as shown in FIG. 1, or can be recorded on a record carrier, such as a magnetic record carrier.

FIG. 3 shows an embodiment of the receiver apparatus in accordance with the invention. The apparatus comprises a receiver unit 40 that receives a transmitted signal transmitted via the transmission medium TRM. An output 42 of the receiver unit 40 is coupled to an output 44 of a demultiplexer circuit 46. A first output 48 of the demultiplexer circuit 46 is coupled to an input 50 of a compression circuit 52, an output 54 of which is coupled to a first input 56 of an error correction decoder circuit 58. The demultiplexer unit 46 is provided with a second output 60 which is coupled to an input 62 of a channel decoder circuit 64. An output 66 of the channel decoder circuit 64 is coupled to a second input 68 of the error correction decoder circuit 58, which has an output 70 which is coupled to an input 72 of an expansion circuit 74. An output 76 of the expansion circuit 74 is coupled to an input of a second channel decoder circuit 80. An output of the channel decoder circuit 80 is coupled to an output terminal 82.

The functioning of the embodiment of FIG. 3 will be explained hereafter, again using the FIGS. 2a to 2f. The datastream of channel encoded information words and channel encoded parity words, indicated by (f), is supplied to the receiver unit 40 and subsequently supplied to the demultiplexer unit 46. The datastream is indicated by (f'), as it refers to the FIG. 2f, where the accent denotes that the datastream received and supplied to the demultiplexer 46 may include errors. The datastream received is subsequently demultiplexed in the demultiplexer unit 46 into two separate data streams, one datastream (b') of channel encoded informations words that is supplied to the output 48 and an other datastream (e') of channel encoded parity words that is supplied to the output 60. The datastream of channel encoded information words is supplied to the compression circuit 52. As regards its functioning, the compression circuit 52 is fully identical to the compression circuit 14 of FIG. 1. Thus, the compression circuit 52 compresses the m-bit channel encoded information words into a compressed word in the same way as described above for the compression circuit 14. The datastream of channel encoded parity words is supplied to the channel decoding circuit 64, which reconverts the channel encoded parity words into a datastream (d') of the original parity words. When the channel encoder circuit 26 is a 8-to-15 bit converter, as in the example described above, then the channel decoding circuit 64 is a 15-to-8 bit converter.

Next, the error correction decoder circuit 58 carries out an error correction decoding step on a compressed word supplied to its input 56, in response to the corresponding parity word supplied to the input 68. This results in a datastream (c) of error corrected compressed words appearing at the output 70 of the decoder circuit 58. The error corrected compressed words are supplied to the expansion circuit 74. The expansion circuit 80 carries out an m-to-n bit conversion on the error corrected m-bit compressed words so as to obtain a sequence of error corrected n-bit information words. When the channel encoder circuit 4 in FIG. 1 is a 172-to-312 bit converter, as in the example described above, then the channel decoding circuit 80 is a 312-to-172 bit converter.

As a result, a datastream of error corrected information words appear at the output terminal 82, that is a replica of the datastream as supplied to the input 1 of the transmitter.

Figure 4:
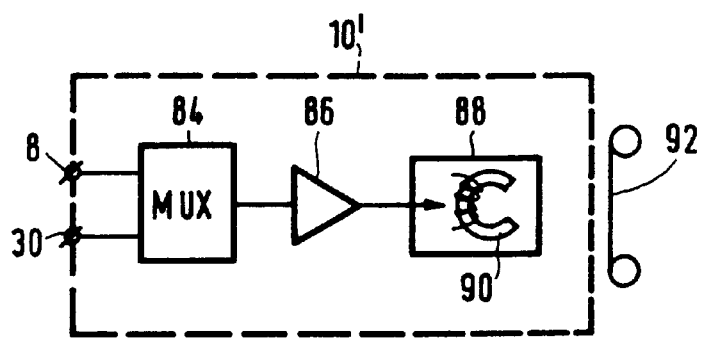
FIG. 4 another embodiment of the formatter unit in the apparatus of FIG. 1.

FIG. 4 shows another embodiment of the formatting unit in the apparatus of FIG. 1. The formatting unit 10' in FIG. 4 comprises a multiplexer unit 84 for multiplexing the two datastreams supplied to the inputs 8 and 30 into a serial datastream, which is supplied, after preamplification in a preamplifier 86 to a write unit 88, comprising at least one write head 90, for writing the channel encoded serial datastream on a record carrier 92, such as a magnetic or optical record carrier.

Figure 5:
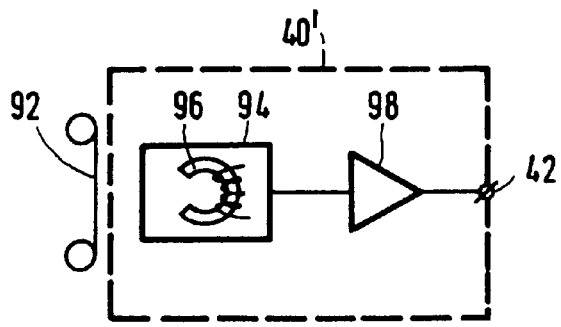
FIG. 5 another embodiment of the receiver unit in the apparatus of FIG. 3.

FIG. 5 shows another embodiment of the receiver unit 40 in the apparatus of FIG. 3. The receiver unit, now denoted by the reference numeral 40' in FIG. 5 comprises a read unit 96 for reading the serial datastream from a record carrier 92, which is supplied, after amplification in an amplifier 98 to the output 42.

Related Documents

European Patent Application EP 671,739 A2, corresponding to U.S. Pat. No. 5,644,582

European Patent Application WO 95/24,775 A3, corresponding to U.S. Pat. No. 5,671,236

D3 International Patent Application No. WO 96/00045

D4 K. A. Schouhamer Immink, 'Coding techniques for digital recorders', Prentice-Hall Int. (UK) Ltd., New Jersey, 1991.

D5 W. G. Bliss, 'Circuitry for performing error correction calculations on baseband encoded data to eliminate error propagation', IBM Techn. Discl. Bull., Vol. 23, pp. 4633–4634, 1981.

These documents are hereby incorporated in whole by reference.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

What is claimed is:

1. An apparatus for transmitting a digital information signal, comprising:

input means for receiving the digital information signal;

first channel encoding means for carrying out a first channel encoding step on an information word in a series of subsequent information words included in the digital information signal so as to form a channel word;

compression means compressing a channel word to form a compressed channel word;

error correction encoding means for error correction encoding the compressed channel word to form a parity word;

second channel encoding means for carrying out a second channel encoding step on the parity word to form a channel encoded parity word; and formatting means for combining the channel word and the channel encoded parity word into a composite transmission signal suitable for transmission via a transmission medium.

2. The apparatus as claimed in claim 1, wherein the first channel encoding means includes means for converting an n-bit information word into an m-bit channel word, where n and m are positive integer values and m is larger than n.

3. The apparatus as claimed in claim 1, wherein the second channel encoding means includes means for converting r-bit parity words into s-bit channel encoded parity words, where r and s are positive integer values and s is larger than r.

4. The apparatus as claimed in claim 1, wherein the formatting means further include writing means for writing the composite transmission signal in a track on a record carrier.

5. An apparatus for receiving a digital information signal, comprising:

receiving means for receiving a composite transmission signal comprising channel words and corresponding channel encoded parity words;

demultiplexer means for retrieving a channel word and a corresponding channel encoded parity word from the composite transmission signal;

compression means for compressing the channel word to form a compressed channel word;

first channel decoding means for channel decoding the channel encoded parity word to form a parity word corresponding to said compressed channel word;

error correction decoding means for error correcting the compressed channel word using said parity word to form a corrected compressed channel word;

expansion means for expanding the corrected compressed channel word to form an uncompressed channel word;

second channel decoding means for channel decoding the uncompressed channel word to form an information word; and output means for supplying the digital information signal in the form of a sequence of information words.

6. The apparatus as claimed in claim 5, wherein the second channel decoding means includes means for converting an m-bit uncompressed channel word into an n-bit information word, where n and m are positive integer values and m is larger than n.

7. The apparatus as claimed in claim 5, wherein the first channel decoding means include means for converting s-bit channel encoded parity words into r-bit parity words, where r and s are positive integer values and s is larger than r.

8. The apparatus as claimed in claim 5, wherein the receiving means further includes reading means for reading the composite transmission signal from a track on a record carrier.

9. The apparatus as claimed in claim 1, wherein n and m are larger than 100.

10. The apparatus as claimed in claim 1, wherein the compression means includees partitioning means for partitioning an m-bit channel word into m/p subwords of p bits each; and conversion means for converting the p-bit subwords into r-bit converted subwords, the m/p converted subwords forming the compressed channel word, wherein p and r are integer values and p is larger than r.

11. The apparatus as claimed in claim 10, wherein said conversion means includes means for choosing p such that the maximum number of different p-bit subwords that can occur in the sequence of m-bit channel words is, at most, equal to $2^r$.

12. A method of transmitting a digital information signal, comprising the steps:

receiving the digital information signal;

carrying out a first channel encoding step on an information word in a series of subsequent information words comprised in the digital information signal to form a channel word;

compressing said channel word to form a compressed channel word;

error correction encoding the compressed channel word to form a parity word;

carrying out a second channel encoding step on the parity word to form a channel encoded parity word; and combining the channel word and the channel encoded parity word into a composite transmission signal suitable for transmission via a transmission medium.

13. The method as claimed in claim 12, wherein the combining step further includes the substep of writing the composite transmission signal in a track on a record carrier.

* * * * *